United States Patent [19]

Seelbach

[11] 4,242,605
[45] Dec. 30, 1980

[54] TRANSIENT ARRAY DRIVE FOR BIPOLAR ROM/PROM

[75] Inventor: Walter C. Seelbach, Scottsdale, Ariz.

[73] Assignee: Motorola, Inc., Schaumburg, Ill.

[21] Appl. No.: 908,311

[22] Filed: May 22, 1978

[51] Int. Cl.³ .......................... H03K 3/01; H03K 3/26; H03K 17/56

[52] U.S. Cl. .................................... 307/270; 307/246; 307/254; 307/300; 365/102

[58] Field of Search ............... 307/246, 270, 293, 300, 307/296; 328/185; 365/102, 149, 225; 361/195

[56] References Cited

U.S. PATENT DOCUMENTS

| | | | |
|---|---|---|---|
| 3,091,705 | 5/1963 | Levine | 307/293 |
| 3,879,137 | 4/1975 | Sakazaki et al. | 307/293 |
| 3,959,782 | 5/1976 | Dunn | 307/246 |
| 4,131,808 | 12/1978 | Kuo | 307/300 |

FOREIGN PATENT DOCUMENTS 2351128  4/1975  Fed. Rep. of Germany .......... 307/246

Primary Examiner—Stanley D. Miller, Jr.
Assistant Examiner—B. P. Davis
Attorney, Agent, or Firm—Vincent B. Ingrassia

[57] ABSTRACT

A radiation hardened circuit for a bit line driver in a ROM or PROM wherein the discharge of the bit line capacitance is enhanced by shorting the current limiting resistor momentarily at the initiation of the discharge cycle and by allowing the bit line charging voltage to go to a value only slightly less than the power supply voltage without sacrificing speed and noise immunity. The result is decreased delay time during the discharge transition without loss in noise immunity.

5 Claims, 3 Drawing Figures

TRANSIENT ARRAY DRIVE FOR BIPOLAR ROM/PROM

Field of the Invention

The invention relates to an improved bit line driver circuit for decreasing transient delay time and for decreasing steady state current drains from the power source while maintaining high noise immunity in general and specifically during periods of high transient noise induced by radiation exposure.

Background of the Invention

In Read Only Memories (ROM) for military applications, it is necessary to make provisions for radiation to prevent malfunctions of the circuits during the radiation periods. The problem arises because diodes tend to appear or act as current sources in the presence of nuclear radiation. When this occurs, bit lines can shift in voltage level toward ground common potential falsely triggering the output to a high response level. One prior art approach to the solution of the problem is shown in FIG. 1, where resistors $R_p$ have been introduced to connect bit lines 10 to source $V_{CC}$. Resistors $R_p$ prevent the undesired shift by providing the leakage currents of the diodes. When excited by radiation, diodes CR-1 appear to be current sources which tend to shift the voltage on bit lines 10 downward through paths to ground via resistors $R_w$.

There are two disadvantages associated with the use of resistors $R_p$, however. First, when current is passed through any of resistors $R_p$, it represents an increase in dissipated power which may not be tolerable in some applications. Second, the use of resistor $R_p$ causes a delay in the low to high ("0" to "1") response at output 12, in response to a corresponding signal change at any one of bit line inputs 14. Part of this undesirable delay is caused by the relatively long time required to discharge capacitance $C_b$ through resistor $R_d$ on bit line 10 when that line goes from the high to the low state as the result of addressing of the particular line by a corresponding signal change at an input 14. $C_b$ represents the total of all capacitance on line 10 and is significant in terms of output signal delay at output terminal 12. When one of transistors 16 is turned on, $C_b$ must be discharged by transistor 16 current through resistor $R_d$. The delay is effectively lengthened because initially $C_b$ is charged to $V_{CC}$ through $R_p$; transistor 16 being initially turned off.

Summary of the Invention

These and other problems of prior art circuits are mitigated by the circuit of the invention. First, in the preferred embodiment of the invention, resistors $R_p$ are not used. Rather, a circuit is used which utilizes two transistors to return each of lines 10 to $V_{CC}$. The voltage drop in these transistors puts the quiescent high state of bit lines 10 close to $V_{CC}$ thereby providing comparable noise immunity to that obtained by using resistors $R_p$, as shown in FIG. 1. Second, the discharge of $C_b$ is also faster because the series resistance, through which $C_b$ must discharge, is shorted out or bypassed by one of the transistors during the initial stage of the discharge time, thus significantly reducing the discharge time.

Therefore, according to one object of the invention, the bit lines of a Read Only Memory, which is subject to exposure to radiation energy, are returned to a voltage supply through two control transistors to enable the discharge of bit line capacitance in a shorter time.

According to another object of the invention, the bit lines of a Read Only Memory, which is subject to exposure to radiation energy, are returned to a voltage supply through two transistors to provide a quiescent voltage on the address lines which is close to $V_{CC}$ and without sacrifice of noise immunity in the circuit.

According to still another object of the invention, the address lines of a Read Only Memory are returned to a voltage supply through two transistors to reduce the current drawn by the system.

These and other objects of the invention will be more readily understood by a study of the Detailed Description of the Invention and the drawings, wherein:

FIG. 1 is a schematic diagram of a typical prior art radiation hardened Read Only Memory, FIG. 2 is a graphic representation of the delay between bit line input signals and output signals in the circuit of FIG. 1, and FIG. 3 illustrates the changes from the circuit of FIG. 1 which comprise the preferred embodiment of the invention.

Detailed Description Of The Invention

Figure 1:
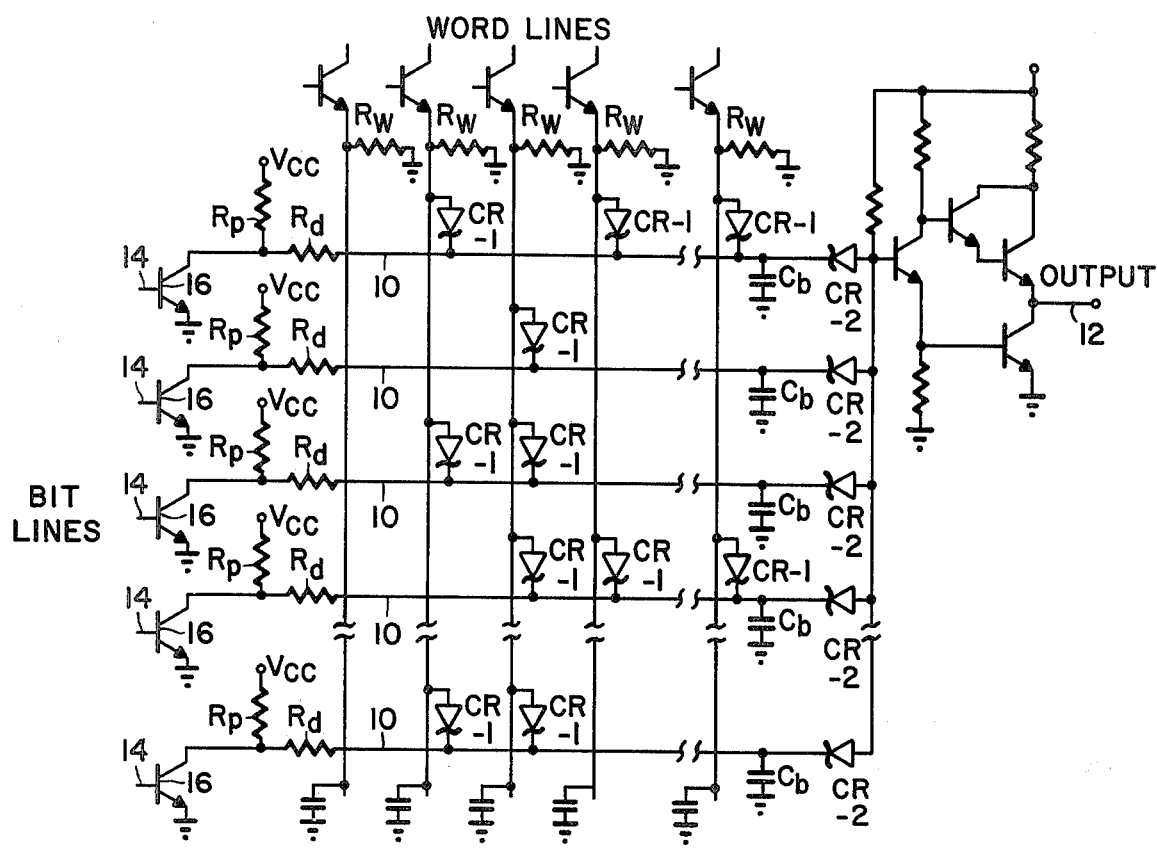
Figure 3:
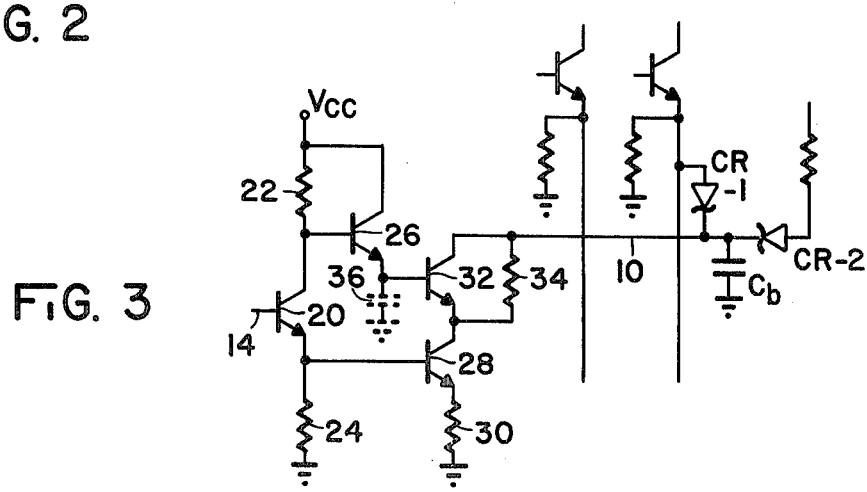

A careful comparison of FIG. 3 with FIG. 1 will show how the invention in FIG. 3 is different from the prior art circuit of FIG. 1. FIG. 3 shows only one bit line 10. The circuit of FIG. 3, in fact, may be repeated for each line 10 of FIG. 1 but only one such circuit is shown for clarity. The input bit line signal is applied to input terminal 14 in both FIGS. 1 and 3. In the circuit of the embodiment of the invention as shown in FIG. 3, the input signal is applied to the base of NPN transistor 20. Of course, the circuit may also be implemented with PNP type transistors, not shown. The collector of transistor 20 is connected to voltage supply $V_{CC}$ through collector load resistor 22. The emitter of transistor 20 is connected to ground or common through resistor 24. The base of NPN transistor 26 is driven from the collector to transistor 20. The collector of transistor 26 is connected to $V_{CC}$. The emitter of transistor 20 drives the base of NPN transistor 28. The emitter of transistor 28 is connected to ground through resistor 30. NPN transistor 32 is across resistor 34, that is, the collector of transistor 32 is connected to one end of resistor 34, and also drives bit line 10, and the emitter of transistor 32 is connected to the other end of resistor 34. The emitter of transistor 32 is also connected to the collector of transistor 28. The remainder of FIG. 3 is the same as corresponding portions of FIG. 1 and the reference numerals and letters are identical for identical components of both FIGS. 1 and 3.

The operation of the preferred embodiment of the invention shown in FIG. 3 is as follows:

In the quiescent or steady state, that is; with a low level bit line signal on input terminal 14, transistor 14 is turned off. This holds transistor 28 off and the base of transistor 26 gets current from power supply $V_{CC}$ through resistor 22. Base current of transistor 26 is limited by resistor 22. The emitter of transistor 26 is $V_{BE}$ volts below the base voltage. The base-collector diode of transistor 32 is turned on by current into its base from the emitter of transistor 26. Line 10 is thus held at a voltage level below $V_{CC}$ by the voltage drop through the base-emitter diode of transistor 26 plus the base-collector diode voltage drop of transistor 32. There is no emitter current in transistor 32 since transistor 28 is held off by turned off transistor 20. Therefore line 10 is held below $V_{CC}$ by the voltage drop caused by the base current of transistor 26 in resistor 22, the $V_{BE}$ of transistor 26 and the base to collector drop in transistor 32. This total drop does not approximate the threshold voltage of the output gate made up of CR-2 diodes. Therefore, the gate operates well above the threshold level and is actively held at that point in contrast to prior art systems which did not employ $R_p$ pull-up resistors.

When the signal on input terminal 14 goes high, transistor 20 conducts. The collector voltage on transistor 20 drops due to the collector current in load resistor 22 and base current to transistor 26 is cut-off. This cuts off transistor 26 which in turn cuts off base current to transistor 32. However, transistor 32 continues to conduct for a short period of time due to stored base charge (as indicated by dashed line capacitance 36). The emitter of transistor 20 supplies base current to transistor 28, allowing it to turn on. Transistor 32 momentarily shorts resistor 34 allowing $C_b$ to discharge rapidly through the relatively low impedances of transistors 32 and 28 to ground. Thus, the signal transition presented to diode CR-2 is delayed by a relatively shorter time than that incurred when $C_b$ must be discharged through a higher impedance, such as $R_d$ in FIG. 1. When the stored base charge in transistor 32 is dissipated, transistor 32 no longer conducts and resistor 34 limits the current in the discharge path and the current through CR-2. Thus, according to the preferred embodiment of the invention as illustrated in FIG. 3, a surge discharge current is provided to remove the charge from $C_b$ and then the current reverts to a much lower level since resistor 34 is then in the circuit. This means that the quiescent current drain is reduced essentially to that of prior art circuits which did not utilize resistors $R_p$ of FIG. 1.

To summarize, the preferred embodiment of the invention, as shown in FIG. 3, provides noise immunity for the bit lines of a ROM without the usually associated increase in quiescent current drain and signal delay.

Figure 2:
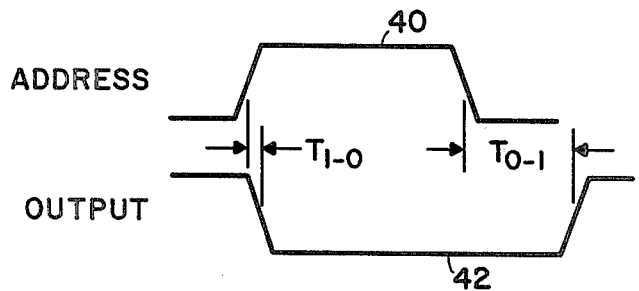

Measurements made on simulation circuits have been used to establish the values of $T_{0-1}$ in Table I, below. $T_{0-1}$ is defined, as shown in FIG. 2, as the delay between the high to low transition of input signal 40 and the low to high transition of bit line signal 42.

TABLE I

| Value of $C_b$ | 40 pf | 50 pf | 60 of |
|---|---|---|---|
| | | $T_{0-1}$ Delay | |
| A. Circuit without noise immunity | 35 ns | 38 ns | 42 ns |

TABLE I-continued

| Value of $C_b$ | 40 pf | 50 pf | 60 of |
|---|---|---|---|
| | | $T_{0-1}$ Delay | |
| B. Circuit with $R_p$ resistor as in FIG. 1 | 72 ns | 88 ns | 100 ns |
| C. Circuit of FIG. 3 | 22 ns | 24 ns | 24 ns |

It should be noted that the circuit of FIG. 3 provides a shorter $T_{0-1}$ transition delay in each case than obtained from prior art circuits with no radiation hardening capabilities at all, as well as representing an improvement over the prior art circuit of FIG. 1.

Various other modifications and changes may be made to the present invention from the principles of the invention as described above without departing from the spirit and scope thereof as encompassed in the accompanying claims.

What is claimed is:

1. A driving circuit for a digital line, the line having a capacitance to ground which is charged upon receipt by said driving circuit of a line signal having a first potential, the combination comprising:
limiting means coupled between said capacitance and ground for limiting discharge current of said capacitance, said capacitance discharging upon receipt by said driving circuit of a line signal having a second potential;
transistor means coupled across said limiting means for momentarily shorting said limiting means to shorten discharge time, said transistor means including charge storage means which is charged in response to said line signal of said first potential; and
series switching means coupled between ground and said limiting means for providing a discharge path for said capacitance in response to said line signal having said second potential.

2. The circuit according to claim 1 wherein said transistor means comprises a transistor having a first electrode connected to a terminal of said limiting means, a second electrode connected to another terminal of said limiting means and a control electrode responsive to said line signal.

3. The circuit according to claim 2 wherein said first electrode is a collector electrode, said second electrode is an emitter electrode and said control electrode is a base electrode, said momentary shorting mode being a function of stored electrical charge on said base electrode.

4. The circuit according to claim 3 wherein said transistor is of an NPN type.

5. The circuit according to claim 3 wherein said transistor is of a PNP type.

* * * * *